United States Patent
Magistretti et al.

(10) Patent No.: US 7,985,959 B2
(45) Date of Patent: Jul. 26, 2011

(54) SELF-ALIGNED VERTICAL BIPOLAR JUNCTION TRANSISTOR FOR PHASE CHANGE MEMORIES

(75) Inventors: Michele Magistretti, Gessate (IT); Fabio Pellizzer, Follina (IT); Augusto Benvenuti, Lallio (IT); Marcello Mariani, Milan (IT)

(73) Assignee: Intel Corporation, Santa Clara, CA (US)

( * ) Notice: Subject to any disclaimer, the term of this patent is extended or adjusted under 35 U.S.C. 154(b) by 272 days.

(21) Appl. No.: 12/218,171

(22) Filed: Jul. 11, 2008

(65) Prior Publication Data

US 2010/0006816 A1    Jan. 14, 2010

(51) Int. Cl.
*H01L 29/02* (2006.01)
*H01L 27/082* (2006.01)

(52) U.S. Cl. .................... 257/2; 257/577; 257/E31.029; 257/E45.001

(58) Field of Classification Search .............. 257/2, 577, 257/E45.001, E31.029
See application file for complete search history.

(56) References Cited

U.S. PATENT DOCUMENTS

| | | | |
|---|---|---|---|
| 2001/0002062 A1* | 5/2001 | Noble et al. | 257/565 |
| 2007/0254446 A1 | 11/2007 | Pellizzer et al. | |
| 2008/0117667 A1* | 5/2008 | Nirschl et al. | 365/163 |

* cited by examiner

*Primary Examiner* — Lex Malsawma
(74) *Attorney, Agent, or Firm* — Trop, Pruner & Hu, P.C.

(57) ABSTRACT

A phase change memory may include self-aligned polysilicon vertical bipolar junction transistors used as select devices. The bipolar junction transistors may be formed with double shallow trench isolation. For example, the emitters of each bipolar transistor may be defined by a first set of parallel trenches in one direction and a second set of parallel trenches in the opposite direction. In some embodiments, the formation of parasitic PNP transistors between adjacent emitters may be avoided.

26 Claims, 5 Drawing Sheets

SELF-ALIGNED VERTICAL BIPOLAR JUNCTION TRANSISTOR FOR PHASE CHANGE MEMORIES

BACKGROUND

This relates to a process for manufacturing fully self-aligned bipolar junction transistors embedded in a complementary metal oxide semiconductor (CMOS) flow. In particular, the present description refers to the manufacture of bipolar junction transistors operating as selection devices in a phase change memory.

Phase change memories are formed by memory cells connected at the intersections of bitlines and wordlines and comprising each a memory element and a selection element. A memory element comprises a phase change region made of a phase change material, i.e., a material that may be electrically switched between a generally amorphous and a generally crystalline state across the entire spectrum between completely amorphous and completely crystalline states.

Typical materials suitable for the phase change region of the memory elements include various chalcogenide elements. The state of the phase change materials is non-volatile, absent application of excess temperatures, such as those in excess of 150° C., for extended times. When the memory is set in either a crystalline, semi-crystalline, amorphous, or semi-amorphous state representing a resistance value, that value is retained until reprogrammed, even if power is removed.

Selection elements may be formed according to different technologies. For example, they can be implemented by diodes, metal oxide semiconductor (MOS) transistors or bipolar transistors.

DETAILED DESCRIPTION

In accordance with some embodiments of the present invention, a self-aligned vertical bipolar junction transistor may be fabricated, as the select device for phase change memory cell, with double shallow trench isolation. Thus, in some embodiments, it is possible to reduce the area of the array of vertical bipolar junction transistors by placing more than one emitter between two base electrodes or contacts. In some embodiments, this may be done while suppressing the formation of a parasitic PNP transistor between two adjacent emitters. In some embodiments, this may be accomplished by forming a self-aligned, raised emitter structure in a bipolar junction transistor to reduce the formation of such parasitic devices.

Figure 1:
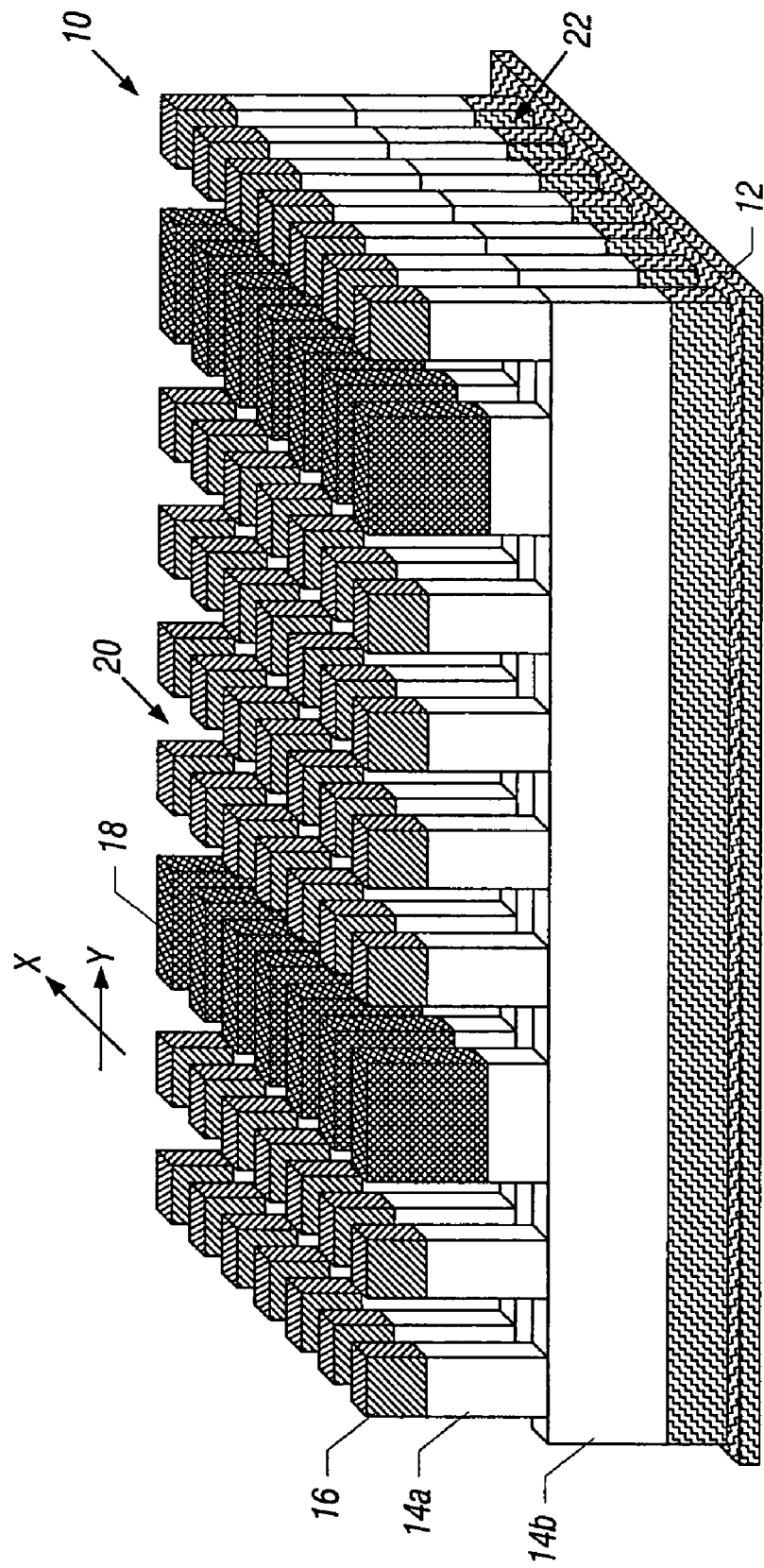
FIG. 1 is an enlarged, partial perspective view of one embodiment.

Referring to FIG. 1, a semiconductor substrate has been doped by a p-type collector implant to form a p-type collector (common) 12 under a shallower base implant that forms an n-type base (wordline) 14 including upper part 14a and lower part 14b. The base implant may be antimony and arsenic in one embodiment. The collector implant may be boron in one embodiment.

A plurality of emitters 16 may be arranged in four columns, each column extending in the X direction, in one embodiment. Each set of four columns of emitters 16 is separated by a column of wider base electrodes or contacts 18. Thus, an X-direction column of base contacts 18 is followed in the Y-direction by four columns of emitters 16, each column extending in the X direction, followed by another column of base contacts 18, and this pattern repeats.

Each row of emitters 16 is separated from an adjacent row by shallow trench isolation 22. Likewise, each column of emitters 16 is separated from adjacent emitters 16 in the X-direction by shallow trench isolation 20. The shallow trench isolation 20 may be much shallower than the shallow trench isolations 22 in this embodiment.

The deeper shallow trench isolations 22 may extend all the way into the p-type collector 12 while the shallow trench isolations 20 may extend only into the n-type base or wordline 14, in one embodiment. Thus, the n-type base or wordline 14 is made up of a lower part 14b which is below the shallow trench isolations 20, and an upper part 14a which is above the bottom of that shallow trench isolation 20.

In one embodiment, the base contacts 18 are n+ base contacts, the emitters 16 are p-type, and of course the wordline is n-type. However, the polarities may also be reversed in some cases. In addition, the number of columns of emitters 16 between base contacts 18 may be more or less than four.

As a result, a bipolar junction transistor is formed with emitters 16, base contacts 18, bases or wordlines 14, and collector 12. The collector 12 is common to all the transistors. The wordline or base 14 is common to each row in the Y-direction. Individual transistors are formed by the segmented emitters 16 and segmented base contacts 18.

Figure 2:
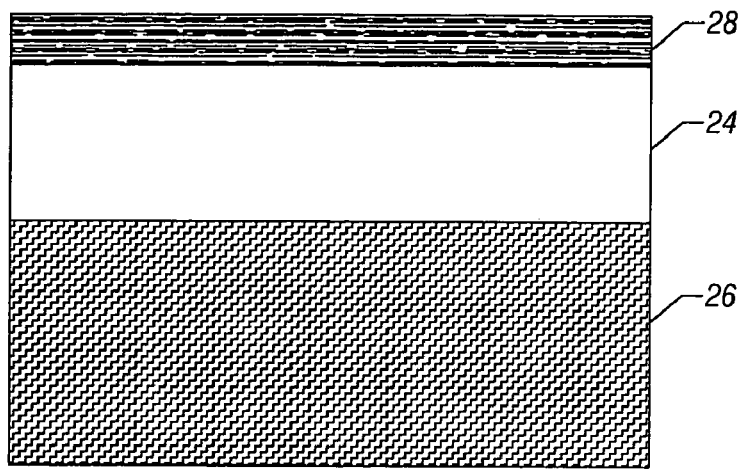
FIG. 2 is an enlarged, cross-sectional view of the Y-array at an early stage of manufacture in accordance with one embodiment.
Figure 3:
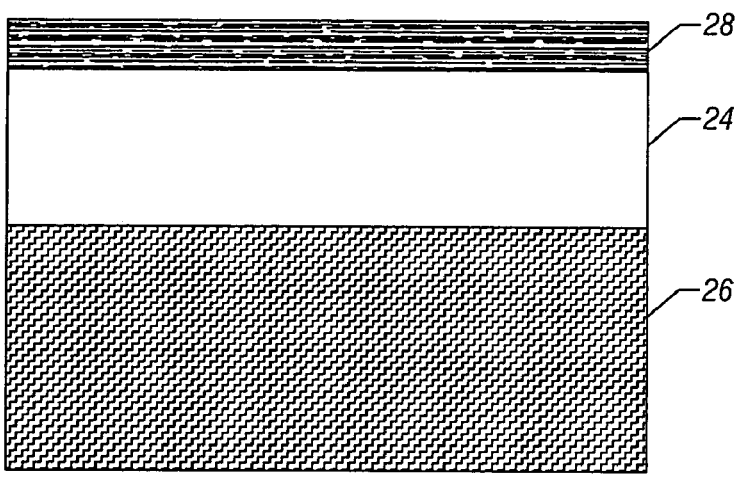
FIG. 3 is an enlarged, cross-sectional view of the X-array at the same stage as FIG. 2 in accordance with one embodiment.

Then, in FIG. 2, the Y-array (i.e., the array viewed in the Y direction of FIG. 1) and in FIG. 3 the X-array (viewed in the direction of FIG. 1) includes a polysilicon layer 24 deposited over the substrate 26. In one embodiment, the polysilicon thickness may be about 160 nanometers. The polysilicon may be amorphous or undoped, as two examples.

A hard mask 28 may be formed on the polysilicon layer 24. The hard mask 28 may be a nitride layer, which may be about 25 nanometers, in one embodiment.

Figure 4:
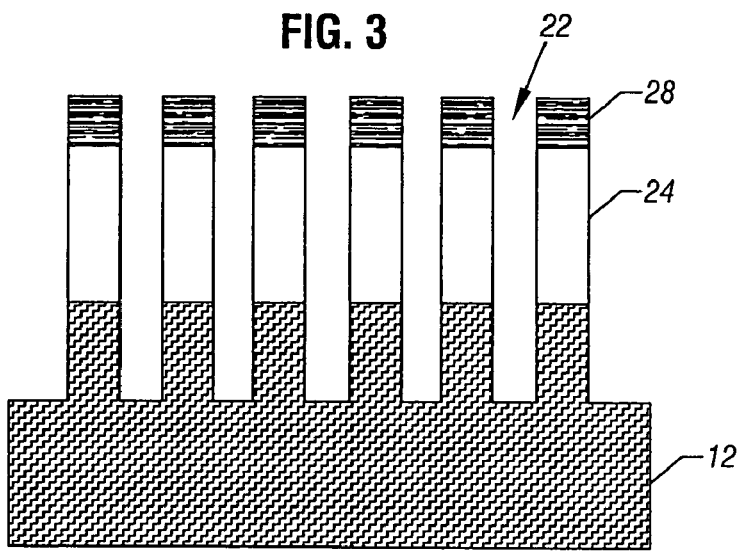
FIG. 4 is an enlarged, cross-sectional view of the Y-array at a subsequent stage in accordance with one embodiment.

Referring next to FIG. 4, a shallow trench isolation patterning forms the narrow trenches in the Y-array. Note that the shallow trench isolations 22 extend in the array all the way through the n− base or wordline 14 into the underlying p-type collector 12.

Figure 5:
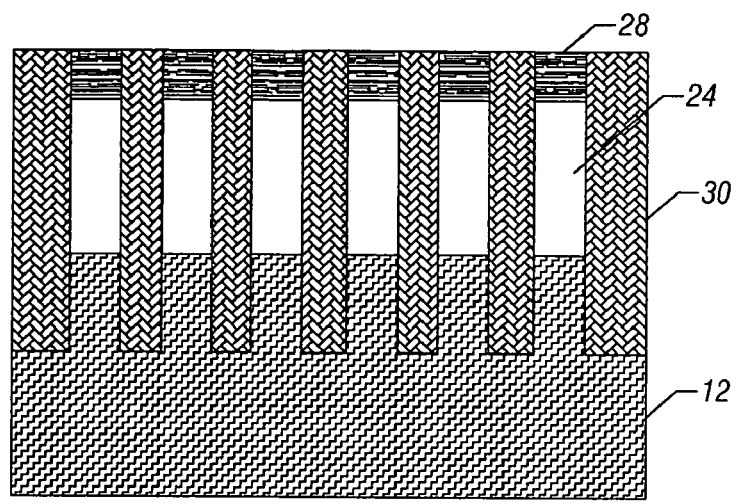
FIG. 5 is an enlarged, cross-sectional view of the Y-array at a subsequent stage in accordance with one embodiment.

Then, in FIG. 5, the isolations 22 are filled with a dielectric fill 30 and planarized. In some embodiments, a thin sidewall dielectric (not shown) may be formed in the trenches before filling. In one embodiment, the fill 30 may be spin on dielectric (SOD), high density plasma (HDP) dielectric, or a sub-atmospheric pressure chemical vapor deposition (SA-CVD) dielectric.

Figure 6:
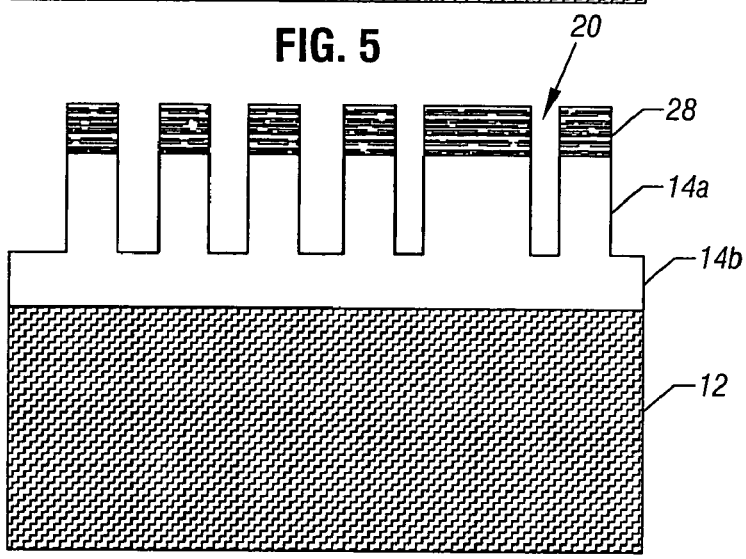
FIG. 6 is an enlarged, cross-sectional view of the X-array at a subsequent stage to FIG. 3 in accordance with one embodiment.

Then, in FIG. 6, a rotated shallow trench isolation mask exposure process is implemented for the X-array. The idea is to form shallow trench isolations 20 in the X direction transverse to the shallow trench isolations 22 already formed.

Figure 7:
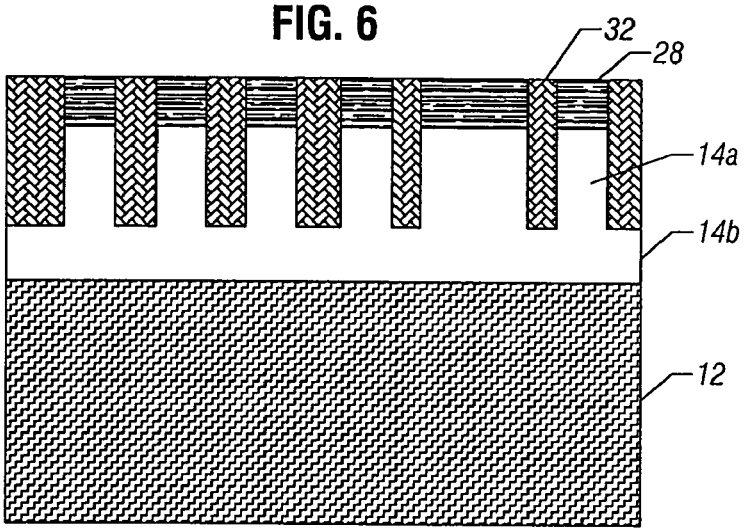
FIG. 7 is an enlarged, cross-sectional view of the X-array at a subsequent stage in accordance with one embodiment.

The X-array trench isolations 20 may be filled with a dielectric fill 32 and planarized, as shown in FIG. 7. In one embodiment, the fill may be spin on dielectric (SOD), HDP dielectric, or a SA-CVD dielectric. The aspect ratio of the trench isolation 20, in some embodiments, may be 4.5 to 1.

Figure 8:
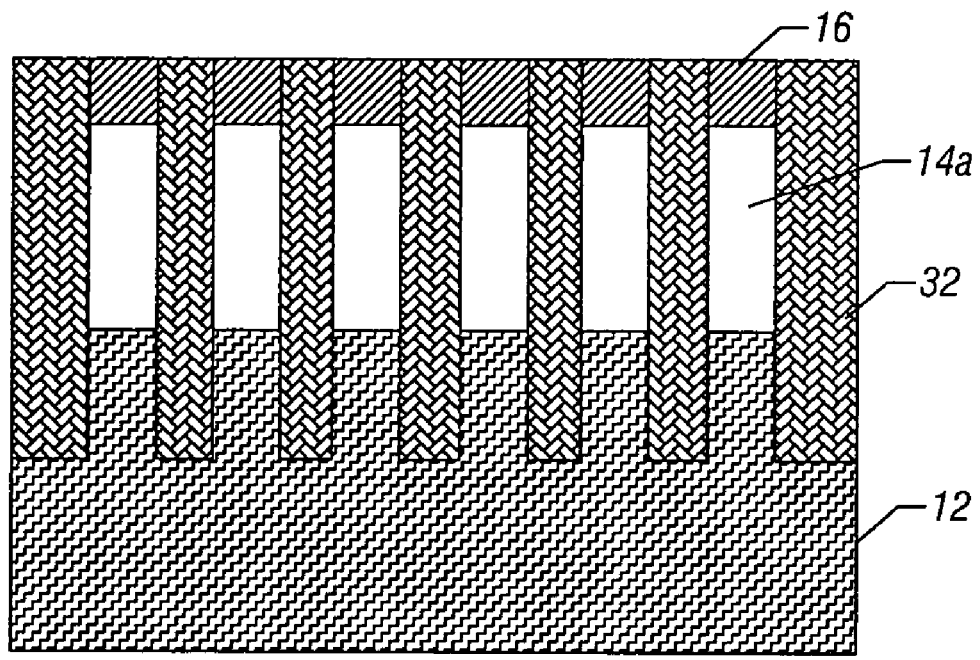
FIG. 8 is an enlarged, cross-sectional view of the Y-array at a subsequent stage to FIG. 5 in accordance with one embodiment.
Figure 9:
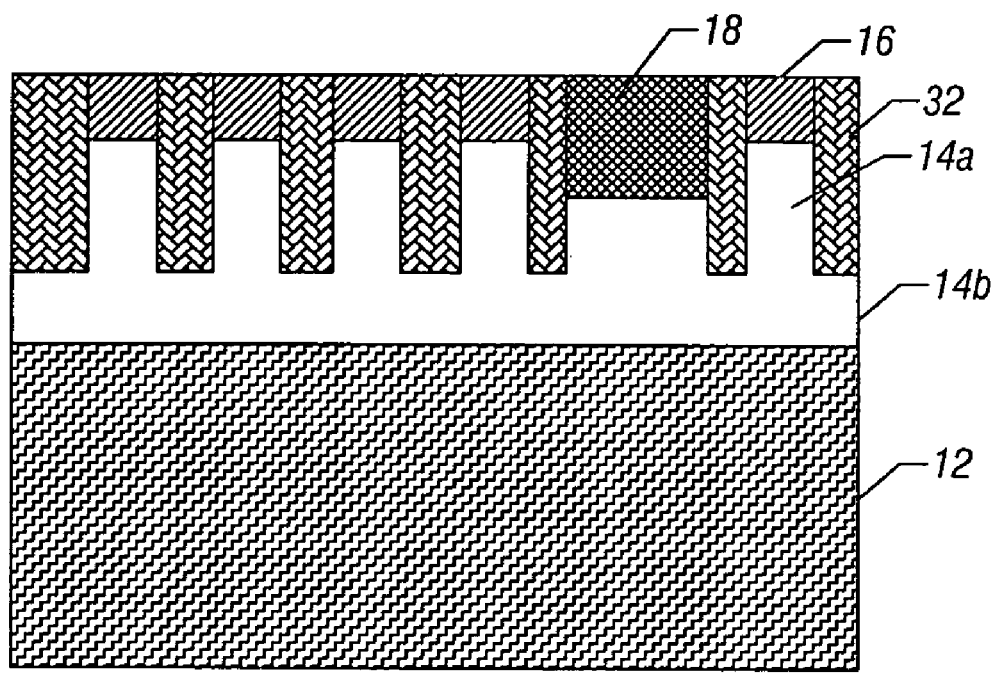
FIG. 9 is an enlarged, cross-sectional view of the X-array at the same stage as FIG. 8 in accordance with one embodiment.

Then, referring to FIG. 8, after removing the hard mask 28, an emitter implantation may be done to form the emitters 16. A base contact implant forms the base contacts 18, as shown in FIG. 9 in the X-array.

Finally, a self-aligned silicidation of the array completes the construction of bipolar transistors. In one embodiment, cobalt may be used to create this silicide.

Figure 10:
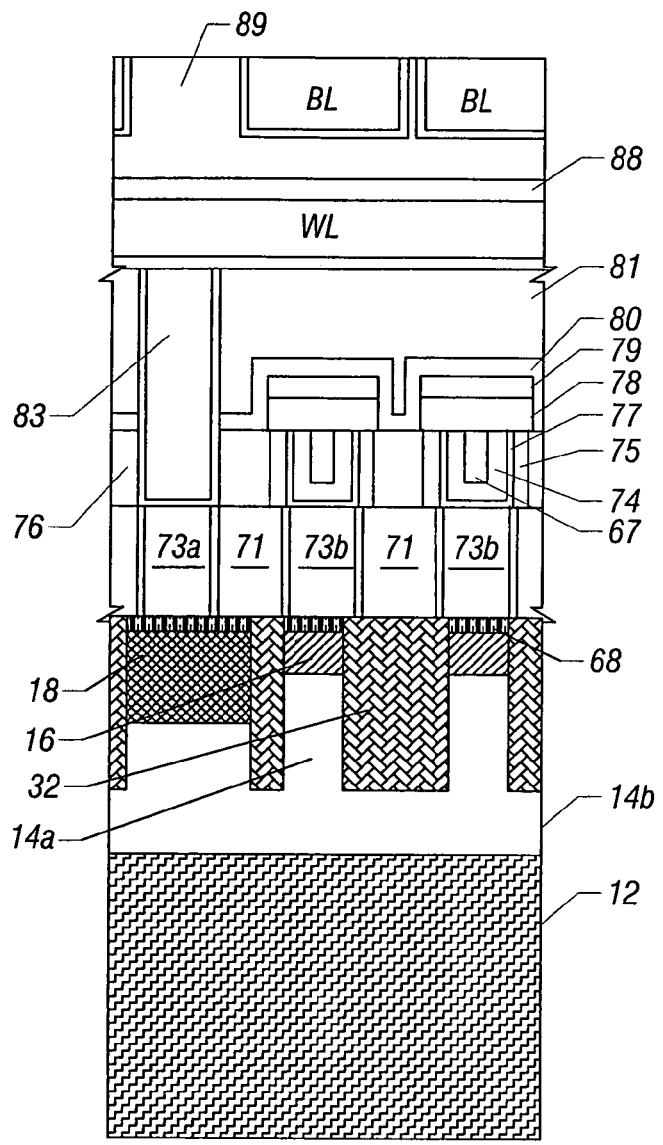
FIG. 10 is a partial, enlarged view after further processing.

In one embodiment, a phase change memory array may be formed over the bipolar junction transistors that act as selection devices for each phase change memory cell. Referring to FIG. 10, the base contact 18 and the emitter contacts 16 may be covered with a first dielectric layer 71 that may be undoped silicon glass with a thickness of 700 nanometers, which is deposited and planarized down to 600 nanometers, in one embodiment.

Thereafter, the first dielectric layer 71 is etched where contacts may be formed so as to form openings that reach the silicide region 68. The apertures may be filled with a barrier layer such as multiple titanium/titanium nitride layers (not shown), and by a tungsten layer (not shown), and the deposited layers may be planarized to form first level plugs 73a and 73b. The first level plugs 73a are in contact with the base contacts 18, and the first level plugs 73b are in electrical contact with the emitter contacts 16.

Then, a second dielectric layer 76 is deposited. Openings are formed in the second dielectric layer 76 above the emitter contacts 16. A spacer layer 75 of silicon nitride is formed on the walls of the openings. Heater layer 77 and a sheath layer 74 may be subsequently deposited to cover the walls and the bottom of the openings. A third dielectric layer 67 may be deposited to fill the openings. The wafer is planarized in one embodiment. Accordingly, the heaters 77 may generally be cup-shaped. The heaters 77 extend on a first level plug 73b which is in electric contact with the emitter contacts 16.

Next, a chalcogenide layer 78, which may be GST ($Ge_2Sb_2Te_5$), and a metal layer 79 are deposited and defined to form resistive bitlines, which run perpendicularly to the plane and the sheet. Metal lines 79 then create a first metal level.

Then, a sealing level 80 and a fourth dielectric layer 81 may be deposited. Holes are opened, coated with a barrier layer, and filled by a metal layer 83 of copper in one embodiment.

Then, wordlines WL from the second-metal layer are formed on the fourth dielectric layer 81 in electrical contact with the second level, base plugs 83, and thus the base regions, through the first level plugs 73c in the base contacts 18. A third nitride layer 88 may be joined over the wordlines WL.

The bitlines BL may be formed in the sixth dielectric layer 89 from a third metal layer.

Programming to alter the state or phase of the material may be accomplished by applying voltage potentials to the heater 77 and the metal layer 79, thereby generating a voltage potential across a memory element including the chalcogenide layer 78. When the voltage potential is greater than the threshold voltages of any select device and memory element, then an electrical current may flow through the phase change layer 26 in response to the applied voltage potentials, and may result in heating of the chalcogenide layer 78.

This heating may alter the memory state or phase of the layer 78, in one embodiment. Altering the phase or state of the phase change layer 78 may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 11:
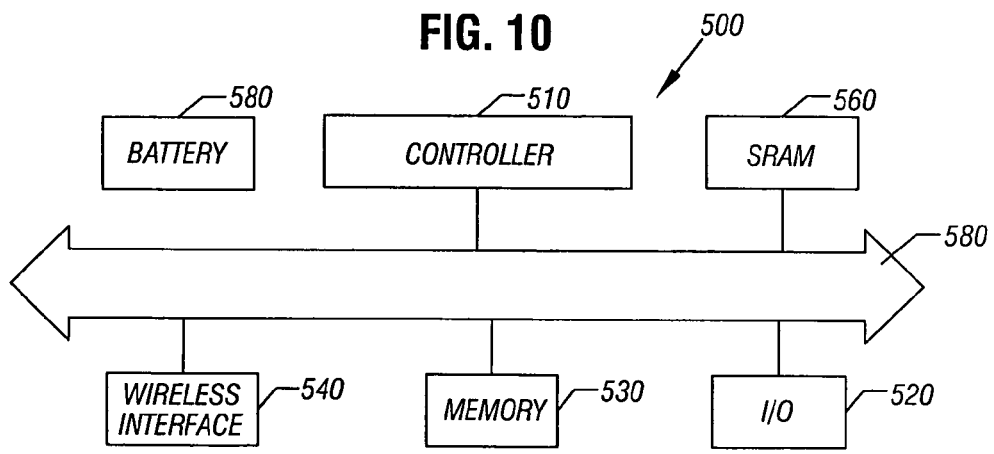
FIG. 11 is a system depiction for one embodiment.

Turning to FIG. 11, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming an array of bipolar transistors, said bipolar transistors including an array of emitters, said emitters being separated from one another by trench isolations, said trench isolations including a first set of parallel trench isolations extending in a first direction and a second set of trench isolations extending in a second direction perpendicular to said first direction;
   forming an array of phase change storage elements over said transistors; and
   providing a plurality of parallel columns of emitters between and extending parallel to a pair of spaced columns of base contacts.

2. The method of claim 1 including forming said emitters as raised emitters.

3. The method of claim 1 including separating said base contacts from said array of emitters by a trench isolation in said first direction and separating said contacts from one another in the same column by a trench isolation in the second direction.

4. The method of claim 3 coupling said emitters and said base contacts to the same base in the second direction.

5. The method of claim 4 coupling all of said emitters and base contacts to the same collector.

6. The method of claim 5 including forming said base contacts as raised contacts and forming said raised contacts by ion implantation.

7. The method of claim 1 including forming said emitters by ion implantation.

8. The method of claim 1 including forming said first set of trenches of a depth different than said second set of trenches.

9. The method of claim 8 including using said first set of trenches to define parallel bases, said first set of trenches being deeper than said second set of trenches.

10. A phase change memory comprising:
    a substrate including a first set of parallel trenches in a first direction and a second set of parallel trenches in a second direction perpendicular to said first direction;
    a plurality of emitters formed in said substrate, each of said emitters being defined by two adjacent parallel trench isolations in each of said first and second directions;
    a plurality of parallel columns of emitters extending in said first direction between a pair of spaced columns of base contacts extending in said first direction; and
    a phase change layer over said substrate.

11. The memory of claim 10 wherein said emitters are raised emitters.

12. The memory of claim 10 wherein said base contacts are separated from said emitters by trench isolation in said first direction and said base contacts are separated from one another by trench isolation in said second direction.

13. The memory of claim 12, a plurality of emitters and base contacts being on the same base, said base extending in said second direction.

14. The memory of claim 13 wherein said emitters and base contacts are coupled to the same collector.

15. The memory of claim 13 wherein said base contacts are raised contacts.

16. The memory of claim 10 wherein said first set of trenches have a first depth and said second set of trenches have a second depth, and said second depth is different from the first depth.

17. The memory of claim 16 wherein said first set of trenches define parallel bases.

18. The memory of claim 17 wherein said first set of trenches are deeper than said second set of trenches.

19. The memory of claim 10 wherein said substrate includes a layer of polysilicon.

20. The memory of claim 10 including bipolar junction transistors that include said emitters.

21. A bipolar transistor array comprising:
    a substrate;
    a plurality of emitters defined in said substrate by a first set of trench isolations extending in a first direction and second set of trench isolations extending in the opposite direction; and
    a plurality of base contacts arranged in said second direction, said plurality of base contacts including a first column of base contacts extending in said second direction and a second column of base contacts extending in said second direction, a plurality of emitters being situated between said first and second columns of base contacts and extending in said second direction.

22. The array of claim 21 including a collector that is common to each of said emitters of the array.

23. The array of claim 22 including a plurality of bases extending in said first direction.

24. The array of claim 23 wherein said trenches in said first direction are deeper than said trenches in said second direction.

25. A system comprising:
    a processor; and
    a memory array including phase change memory cells, each cell including a bipolar transistor select device under a phase change memory cell, each bipolar transistor including an emitter, said emitter being defined by a pair of parallel trenches in a first direction and a second pair of parallel trenches in a perpendicular direction wherein said bipolar transistors include bases defined by parallel trenches in said first direction, said bases being common to a plurality of emitters.

26. The system of claim 25, wherein said bipolar transistors include a common collector.

* * * * *